(12) United States Patent
Weisbuch et al.

(10) Patent No.: US 7,768,024 B2
(45) Date of Patent: *Aug. 3, 2010

(54) HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH

(75) Inventors: Claude C. A. Weisbuch, Paris (FR); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 217 days.

This patent is subject to a terminal disclaimer.

(21) Appl. No.: 11/633,148

(22) Filed: Dec. 4, 2006

(65) Prior Publication Data
US 2007/0125995 A1    Jun. 7, 2007

Related U.S. Application Data

(60) Provisional application No. 60/741,935, filed on Dec. 2, 2005.

(51) Int. Cl.
*H01L 29/06* (2006.01)
(52) U.S. Cl. .............................. 257/98; 257/13; 257/79; 257/435; 257/436; 257/E33.067; 257/E51.021; 438/29; 438/31; 438/32
(58) Field of Classification Search .................. 257/98, 257/79, 13, 29, 31, 32
See application file for complete search history.

(56) References Cited

U.S. PATENT DOCUMENTS

| | | | |
|---|---|---|---|
| 7,098,589 B2 | 8/2006 | Erchak et al. | |
| 7,223,998 B2 | 5/2007 | Schwach et al. | |
| 7,345,298 B2 * | 3/2008 | Weisbuch et al. | ............. 257/13 |
| 2005/0205884 A1 | 9/2005 | Kim et al. | |
| 2006/0009006 A1 | 1/2006 | Murai et al. | |
| 2006/0175624 A1 | 8/2006 | Sharma et al. | |
| 2006/0192217 A1 | 8/2006 | David et al. | |
| 2006/0194359 A1 | 8/2006 | Weisbuch et al. | |
| 2006/0202226 A1 | 9/2006 | Weisbuch et al. | |
| 2006/0234486 A1 | 10/2006 | Speck et al. | |
| 2006/0246722 A1 | 11/2006 | Speck et al. | |
| 2007/0001186 A1 | 1/2007 | Murai et al. | |
| 2007/0085100 A1 | 4/2007 | Diana et al. | |
| 2007/0102721 A1 | 5/2007 | DenBaars et al. | |
| 2007/0121690 A1 | 5/2007 | Fujii et al. | |

OTHER PUBLICATIONS

International Search Report mailed Jul. 11, 2008, International Application No. PCT/US06/46257.

(Continued)

*Primary Examiner*—Long Pham
(74) *Attorney, Agent, or Firm*—Gates & Cooper LLP (57) ABSTRACT

A structure using integrated optical elements is comprised of a substrate, a buffer layer grown on the substrate, one or more first patterned layers deposited on top of the buffer layer, wherein each of the first patterned layers is comprised of a bottom lateral epitaxial overgrowth (LEO) mask layer and a LEO nitride layer filling holes in the bottom LEO mask layer, one or more active layers formed on the first patterned layers, and one or more second patterned layers deposited on top of the active layer, wherein each of the second patterned layers is comprised of a top LEO mask layer and a LEO nitride layer filling holes in the top LEO mask layer, wherein the top and/or bottom LEO mask layers act as a mirror, optical confinement layer, grating, wavelength selective element, beam shaping element or beam directing element for the active layers.

21 Claims, 6 Drawing Sheets

OTHER PUBLICATIONS

Eriksson, N. et al., "Highly directional grating outcouplers with tailorable radiation characteristics," IEEE J. Quant. Electronics, 1996, vol. 32, 1038.

Suhara, T. et al., "Broad area and MOPA lasers with integrated grating components for beam shaping and novel functions," Proc. SPIE, 2003, vol. 4995, 10.

* cited by examiner

HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH

CROSS-REFERENCE TO RELATED APPLICATIONS

This application claims the benefit under 35 U.S.C Section 119(e) of U.S. Provisional Application Ser. No. 60/741,935, filed on Dec. 2, 2005, by Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH,";

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING", which application claims the benefit under 35 U.S.C Section 365(c) of PCT Application Ser. No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING";

U.S. Utility application Ser. No. 11/054,271, filed on Feb. 9, 2005, by Rajat Sharma, P. Morgan Pattison, John F. Keeling, and Shuji Nakamura, entitled "SEMICONDUCTOR LIGHT EMITTING DEVICE";

U.S. Utility application Ser. No. 10/938,704, filed on Sep. 10, 2004, by Carole Schwach, Claude C. A. Weisbuch, Steven P. DenBaars, Henri Benisty and Shuji Nakamura, entitled "WHITE, SINGLE OR MULTICOLOR LED BY RECYCLING GUIDED MODES", now U.S. Pat. No. 7,223,998, issued May 29, 2007;

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS", now U.S. Pat. No. 7,344,958, issued Mar. 18, 2008, which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE,", now U.S. Pat. No. 7,345,298 issued Mar. 18, 2008;

U.S. Utility application Ser. No. 11/067,910, filed Feb. 28, 2005, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,", now U.S. Pat. No. 7,291,864, issued Nov. 6, 2007;

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (Al, IN, GA)N WAFERS,", which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (Al, IN, GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (Al, IN, GA)N LAYERS,", which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (Al, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,", which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD,", U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,", and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),";

U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES,";

U.S. Provisional Patent Application Ser. No. 60/802,993, filed on May 24, 2006, by Umesh K. Mishra, James S. Speck and Claude C. A. Weisbuch, entitled "IMPROVED LATERAL OVERGROWTH FOR LIGHT EMITTING DIODES (LEDS) AND LASERS";

U.S. Provisional Patent Application Ser. No. 60/809,774, filed on May 31, 2006, by Nicholas A. Fichtenbaum, Umesh K. Mishra, Carl J. Neufeld and Stacia Keller, entitled "OPTOELECTRONIC DEVICES FORMED BY REGROWTH ON N-POLAR NANOPILLAR AND NANOSTRIPE ARRAYS";

U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LED THROUGH MULTIPLE EXTRACTORS";

U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES";

U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS";

U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,";

U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,"; and U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

all of which applications are incorporated by reference herein.

BACKGROUND OF THE INVENTION

1. Field of the Invention

The present invention is related to improved horizontal emitting, vertical emitting, beam shaped, distributed feedback (DFB) lasers fabricated by growth over a patterned substrate with multiple overgrowth.

2. Description of the Related Art

A laser diode is a semiconductor device that emits light in a stimulated manner when electrically biased in the forward direction, the feedback required to reach auto oscillation being provided by mirrors. The mirrors are usually obtained by cleaved facets or mirror-coated facets, in the case of horizontal in-plane lasers, or by dielectric multilayer mirrors, in the case of vertical cavity surface emitting lasers (VCSELs). Some lasers incorporate a dispersive element, such as a grating providing distributed feedback (DFB), to achieve single mode emission.

Lasers are comprised of a chip of semiconducting material impregnated, or doped, with impurities to create a structure called a pn junction. When forward biased, electrons are injected into the junction from the n-region and holes are injected from the p-region, usually in a thin emitting layer called a quantum well. The electrons and holes release energy in the form of photons as they recombine. The wavelength of the light, and therefore its color, depends on the bandgap energy of the materials forming the pn junction.

As semiconductor materials have improved, the efficiency of semiconductor devices has also improved, and new wavelength ranges have been achievable. Gallium Nitride (GaN) based lasers are probably the most promising in a variety of applications. GaN provides efficient emission from the ultraviolet (UV) to amber spectrum, when alloyed with varying concentrates of indium (In), for example.

Unfortunately, besides huge materials challenges, nitride lasers are difficult to manufacture. The cleaved facets have a low reflectivity due to the low refractive index of nitrides. Moreover, cleavage is hard to achieve because of the sapphire substrate. To obtain good nitride lasers, it is therefore desirable to obtain good mirrors with a planar fabrication technique.

Other functions are also desirable, such as vertical emission, high power, single mode emission, etc. VCSELS are, however, extremely hard to obtain, as the high quality mirrors required prove extremely difficult to manufacture, and VCSEL action has not yet been obtained in GaN based lasers.

U.S. Utility application Ser. No. 11/067,957, which is set forth above and incorporated by reference herein, is aimed at solving these challenges by using device growth techniques over patterned substrates, wherein the patterns have the functions of mirrors, light extractors, and beam shaping elements.

However, a serious problem arises with the structures described in U.S. Utility application Ser. No. 11/067,957, In semiconductor lasers, optical confining layers are used to confine the laser mode away from the metal top electrode. Such confining layers must have an index of refraction smaller than that of the active layer, and therefore somewhat repel the optical wave into the active region, thus leading to a weaker interaction between the laser wave and the electrode.

This solution cannot be used in the structures described in U.S. Utility application Ser. No. 11/067,957, The confining power of the typical materials used to confine light in a nitride materials system, e.g. Aluminum Gallium Nitride (AlGaN), is not strong enough, because the typical materials do not have a high enough refractive index contrast with the active material GaN. Then, if a thick top confining layer is used to separate the optical wave from the metal electrode, the optical wave will be poorly confined in the active material region, meaning that it will only weakly interact with the pattern of the LEO mask layer.

Some classic solutions can be used to improve the situation, for instance, by using different thicknesses of confining layers under the top electrode and in the region of the mirror patterns. However such solutions introduce new fabrication steps, and lead to some degree of radiation loss, for instance, at the junction between thinner and thicker confining layers.

There is a need, then, for improved methods for fabricating horizontal emitting, vertical emitting, beam shaped, distributed feedback (DFB) lasers, by growth over a patterned substrate, with multiple overgrowth. The present invention satisfies this need.

SUMMARY OF THE INVENTION

The present invention describes a method of fabricating a structure using integrated optical elements. A buffer layer is grown on a substrate, and one or more first patterned layers are deposited on top of the buffer layer, wherein each of the first patterned layers is comprised of a bottom lateral epitaxial overgrowth (LEO) mask layer and a LEO nitride layer filling holes in the bottom LEO mask layer. One or more active layers are then formed on the first patterned layers. One or more second patterned layers are deposited on top of the active layers, wherein each of the second patterned layers is comprised of a top LEO mask layer and a LEO nitride layer filling holes in the top LEO mask layer. Each patterned layer may act as a mirror, optical confinement layer, grating, wavelength selective element, beam shaping element or beam directing element for the active layers.

Moreover, the first and/or second pattern layers provide the following features:
  due to a high index difference with the active layer, the patterned layers efficiently confine a laser mode to the active layer;
  the patterned layers provide a current aperture giving gain guided action;
  the patterned layers provide lateral waveguiding for the laser mode; and
  the patterned layers isolate the laser mode from one or more electrodes, thus diminishing absorption losses.

Furthermore, one of the first or second patterned layers may not diffract light. The one of the first or second patterned layers that does not diffract, may be patterned as an ensemble of silicon dioxide stripes along a direction of laser light propagation. The one of the first or second patterned layers that does not diffract may comprise end regions that are patterned with diffracting or reflecting elements. The mask layers may comprise silicon dioxide.

The first or second patterned layer may have separate gain and two mirror regions. The gain and mirror regions may have different periods, one of the mirrors may comprise an extraction region for extracting or outcoupling. The separate gain, mirror and extraction regions may have different growth depths, defined by etching of the first or second patterned layers, to provide improved mirror properties for lasing in the gain and mirror regions and outcoupling in the extraction region, and wherein a guided mode interacts more strongly with silicon dioxide columns in the mirror regions.

The second patterned layer may be doped with either an n-type impurity or a p-type impurity.

The present invention also discloses a method of fabricating a structure using integrated optical elements, comprising growing a buffer layer on a substrate, depositing one or more first patterned layers on top of the buffer layer, wherein each of the first patterned layers is comprised of a bottom lateral epitaxial overgrowth (LEO) mask layer and a LEO nitride layer filling holes in the bottom LEO mask layer, forming one or more active layers on the first patterned layers, depositing one or more second patterned layers on top of the active layers, wherein each of the second patterned layers is comprised of a top LEO mask layer and a LEO nitride layer filling holes in the top LEO mask layer, wherein each patterned layer acts as a mirror, optical confinement layer, grating, wavelength selective element, beam shaping element or beam directing element for the active layers.

The present invention further discloses a structure using integrated optical elements, comprising a substrate, a buffer layer, one or more bottom confining layers and one or more active layers grown on the substrate, and one or more patterned layers deposited on top of the active layers, wherein each of the patterned layers is comprised of a top LEO mask layer and a LEO nitride layer filling holes in the top LEO mask layer, and wherein the top LEO mask layers act as a mirror, optical confinement layer, grating, wavelength selective element, beam shaping element or beam directing element for the active layers. The patterned layers may have the same features as the first and second patterned layers described above.

The present invention further discloses a method of fabricating a structure using integrated optical elements may comprising growing a buffer layer on a substrate, growing one or more bottom confining layers on the buffer layer, and growing one or more active layers on the bottom confining layer, depositing one or more patterned layers on top of the active layers, wherein each of the patterned layers is comprised of a top LEO mask layer and a LEO nitride layer filling holes in the top LEO mask layer, wherein the patterned layers act as a mirror, optical confinement layer, grating, wavelength selective element, beam shaping element or beam directing element for the active layers.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention relates to improving semiconductor lasers incorporating buried grating mirrors and photonic crystals, and more particularly, to new structures grown on substrates patterned by these gratings and photonic crystals. Specifically, the present invention describes new laser structures with improved contact structures and reduced waveguiding loss by contact electrodes, wherein these laser structures rely on active layers directly grown on patterned substrates with multiple Lateral Epitaxial Overgrowth (LEO).

Similar to the structures described in U.S. Utility application Ser. No. 11/067,957, the present invention is comprised of a substrate, a buffer layer grown on the substrate, a first patterned layer deposited on top of the buffer layer and comprised of insulating, semiconducting or metallic material, and an active layer deposited on top of the first patterned layer and comprised of single or multiple current-injected quantum wells (QWs). In addition, the present invention includes a second patterned layer deposited on top of the active layers and comprised of insulating, semiconducting or metallic material. Preferably, the patterned layers and active layers are grown by LEO. Eventually, double LEO can be used to ensure better materials and optoelectronic properties.

The first patterned layer is comprised of a bottom LEO mask layer, and a LEO nitride layer filling holes in the bottom LEO mask layer. Similarly, the second patterned layer is comprised of a top LEO mask layer, and a LEO nitride layer filling holes in the top LEO mask layer. The top and/or bottom LEO mask layers act as a mirror, optical confinement layer, grating, wavelength selective element, beam shaping element or beam directing element for the active layers.

Moreover, the first and/or second patterned layers provide the following features:
due to a high index difference with the active layer, the patterned layers efficiently confine a laser mode to the active layer;
the patterned layers provide a current aperture giving gain guided action;
the patterned layers provide lateral waveguiding for the laser mode; and
the patterned layers isolate the laser mode from one or more electrodes, thus diminishing absorption losses.

These factors lead to an improved operation of the laser and other structures proposed in U.S. Utility application Ser. No. 11/067,957.

In a simpler implementation, only the top LEO and mask layers are fabricated after a standard growth of the buffer layer, bottom confining layer and active layer.

The new lasers also rely on a planar fabrication process, making them easily manufacturable at low cost.

Technical Description

Usually, the laser mode in an in-plane laser interacts quite strongly with a top metal electrode—the more so in LEO lasers (as described in U.S. Utility application Ser. No. 11/067,957, because the active layer has to be thin in these structures, where the laser light interacts strongly with the patterned mask layer, so that the patterned mask layer plays its role as laser mirror.

Usually, the top optical confining layers are used to confine the laser mode away from the metal top electrode. Such confining layers have an index of refraction lower than that of the active layer, and therefore somewhat repel the optical wave into the active region, thus leading to a weaker interaction between the laser wave and the electrode, as shown in FIG. 1.

Figure 1:
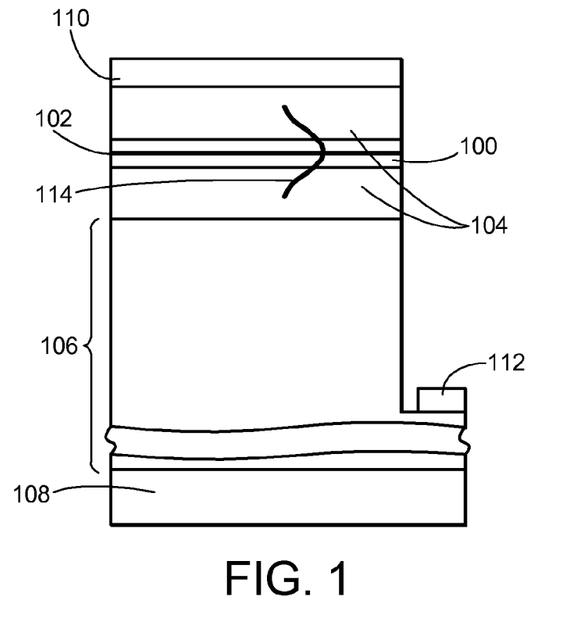
FIG. 1 illustrates a typical laser structure, with typical size values, showing the active layer and AlGaN optical confining layers.

FIG. 1 illustrates a typical laser structure with typical size values comprising an active layer (100), for example a 200 nm thick GaN layer and quantum wells (102), adjacent two AlGaN optical confining layers (104), which may be, for example, 1500 nm thick, wherein the confining layers (104) are deposited on a buffer layer (106), which may be, for example, 2-5 microns thick, and the buffer layer (106) is deposited on a substrate (108). The structure also comprises a top metal electrode (110) and a bottom metal electrode (112). The confining layers also concentrate the laser wave (114) around the active material, typically quantum wells (102), which helps improve performance, for instance, decreasing the lasing threshold current.

In the lasers and other structures described in U.S. Utility application Ser. No. 11/067,957, thin active layers and strong confinement are used to obtain good overlap of the laser mode with the bottom pierced silicon dioxide (SiO$_2$) LEO mask layer, so the LEO mask layer has good optical properties, such as a high reflectivity mirror, efficient vertical diffraction or good waveguiding. The bottom pierced SiO$_2$ LEO mask layer can play the role of the bottom confining layer, as shown in FIG. 2.

Figure 2:
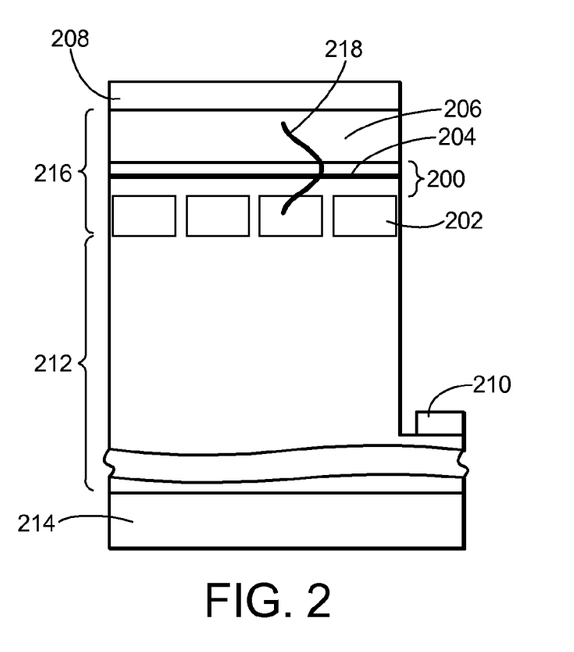
FIG. 2 is a schematic of a device with an active layer grown over a patterned substrate by lateral epitaxial overgrowth (LEO).

FIG. 2 is a schematic of a device, with an active layer (200) grown over a patterned substrate by LEO. Compared to typical LEO structures, the present invention uses a SiO$_2$ pattern as a growth mask (202), but also as an essential component to define the laser components, such as optical and carrier confinement components and end mirrors (see FIGS. 8-10 below). The laser therefore requires a specific design for the bottom pierced SiO$_2$ LEO mask layer (202), and a precisely grown thin, for example 200 nm thick, active layer (200) with optimally positioned emitting species, such as quantum wells (204). FIG. 2 also shows how the device comprises an optical confining layer (206), for example 1500 nm thick AlGaN, a top metal electrode (208), a bottom metal electrode (210), a buffer layer (212), which may be, for example, 2-5 microns thick, and a substrate (214). A LEO grown layer (216) comprises the active layer (200) and the optical confining layer (206).

Note that having a top AlGaN confining layer (206), as shown in FIG. 2, is far from optimum. AlGaN is difficult to grow, has poor electrical conductivity, has an index of refraction near that of GaN, thus providing poor optical confinement, i.e., being somewhat ineffective to repel the laser wave (218) from the electrode (208).

Figure 3:
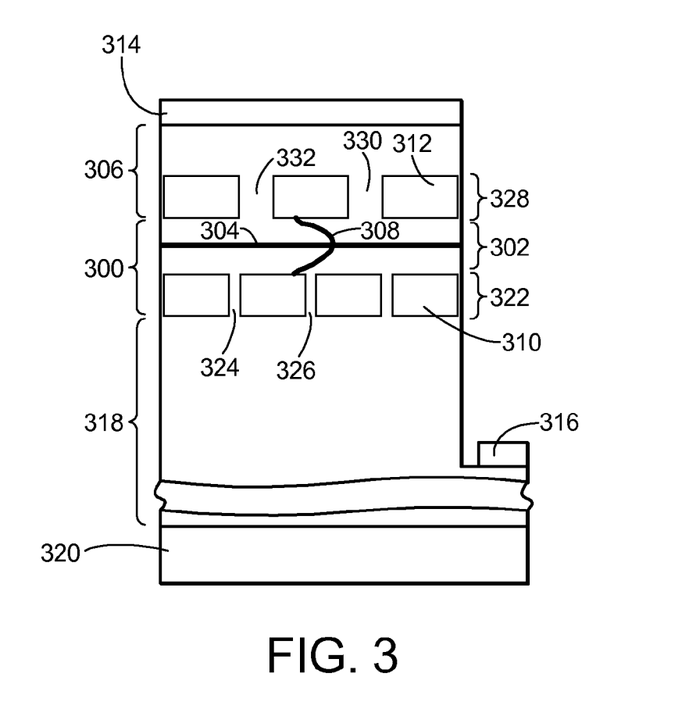
FIG. 3 is a schematic of a device with two LEO grown layers.

The use of a second LEO mask and overgrown layer, on top of the active layer, provides a strong confinement of the laser mode in the active layer, as shown in FIG. 3.

FIG. 3 is a schematic of a device with two LEO grown layers, wherein the bottom, or first LEO grown layer (300) comprises the active layer (302), typically GaN, which may be 200 nm thick, with, for example, GaInN quantum wells (304), and is doped with n and p impurities on the top and bottom of the first LEO grown layer (300), respectively, or vice versa, to ensure bipolar carrier injection. The top or second LEO grown layer (306) has only one type of impurity, similar to that of the portion of bottom LEO grown layer (300) nearest to it, and may be 500 nm thick, for example. Note the excellent confinement of the laser optical wave (308), provided by the first (bottom) (310) and second (top) (312) LEO mask layers, because of the masks' (310),(312) much lower index of refraction as compared to the active layer's (302) refractive index. FIG. 3 also shows the top (314) and bottom (316) metal electrodes, and buffer layer (318) on a substrate (320).

Therefore, FIG. 3 is an example of a structure using integrated optical elements, comprising a substrate (320), a buffer layer (318) grown on the substrate (320), one or more first patterned layers (322) deposited on top of the buffer layer (318), wherein each of the first patterned layers (322) is comprised of a bottom lateral epitaxial overgrowth (LEO) mask layer (310) and a first LEO nitride layer (324) filling holes (326) in the bottom LEO mask layer (310), one or more active layers (302) formed on the first patterned layers (322), and one or more second patterned layers (328) deposited on top of the active layer (302), wherein each of the second patterned layers (328) is comprised of a top LEO mask layer (312) and a second LEO nitride layer (330) filling holes (332) in the top LEO mask layer (312), wherein the top (312), bottom (310), or top (312) and bottom (310) LEO mask layers act as a mirror, optical confinement layer, current aperture, grating, wavelength selective element, beam shaping element or beam directing element for the active layers.

The high index contrast between the second patterned layer (328) comprising the top SiO$_2$ LEO mask layer (312), and the active layer (302), makes the laser wave (308) interact efficiently with the first, or bottom, SiO$_2$ mask layer (310) acting as a photonic crystal. In addition, the second or top mask layer (312) will (i) provide isolation of the laser mode from the lossy top electrode (314), (ii) define a current aperture feeding the laser gain region, and (iii) provide lateral waveguiding for the laser mode (308).

The present invention uses a new LEO sequence, comprising a patterned thin layer, hereafter called the LEO mask layer, and a LEO grown GaN layer, on top of a buffer layer, and an active LEO layer, as described in U.S. Utility application Ser. No. 11/067,957. The main difference for the top LEO grown GaN layer is that it is uniformly doped (usually p-type, as the top electrode is usually hole-injecting), whereas the LEO grown active layer is doped with both n and p dopants to form a pn junction.

The second patterned layer (306) comprising the top LEO mask layer (312), due to the high index difference with the active layer material (302), can then efficiently confine the laser mode (308) to the active region (302), as shown in FIG. 3. The bottom LEO mask layer (310) can then act as (1) an efficient mirror (a so-called photonic crystal mirror), (2) as a diffraction grating directing light from the active layer towards the surface (an outcoupler, for example), (3) as a wavelength selective element (DFB), or (4) as a beam shaping element, as described in U.S. Utility application Ser. No. 11/067,957.

Moreover, this role as a photonic crystal mirror, or diffraction grating, can be equally be performed by the top or bottom LEO mask layers, or both mask layers.

For example, it can be advantageous that one of the LEO mask layers does not diffract. In that case, one of the LEO mask layers can be patterned as an ensemble of SiO$_2$ stripes along the direction of laser light propagation, as shown in FIGS. 4, 6, and 7.

Figure 4:
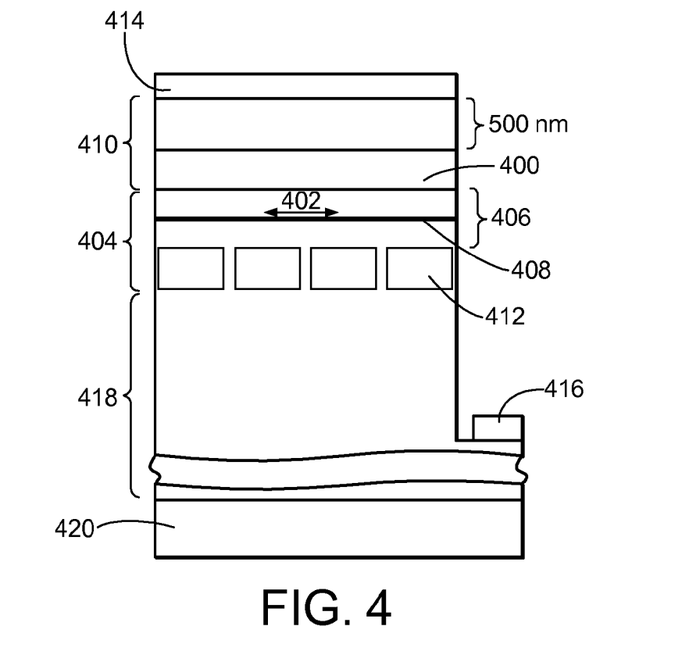
FIG. 4 is a schematic of a double LEO laser with a top mask layer made of stripes.
Figure 5:
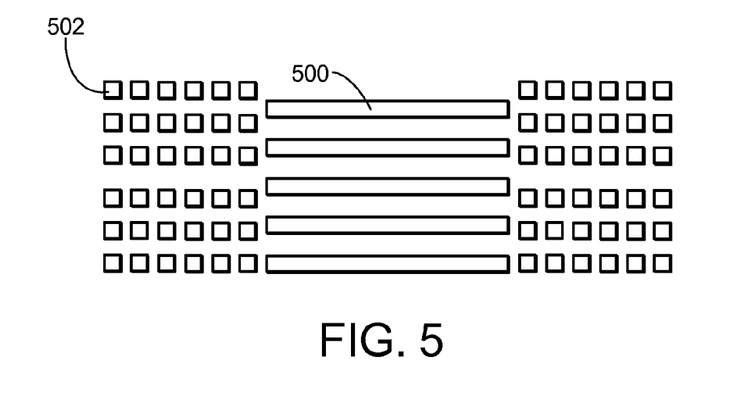
FIG. 5 is a schematic top view of the first (bottom) $SiO_2$ mask layer, wherein the laser active region is delineated with long stripes, and the end regions with diffracting or reflecting elements acting as laser mirrors.

FIG. 4 is a schematic of a double LEO laser, according to the present invention, with top (or second) mask layer (400), comprising stripes (500), as shown in FIG. 5, wherein the stripes are along the laser wave propagation direction (402) to avoid diffraction by the second (top) mask layer (400). FIG. 4 also illustrates the first LEO grown layer (404), comprising the active layer (406), typically GaN, which may be 200 nm thick, with, for example, quantum wells (408), second LEO grown layer (410), first (or bottom) (412) LEO mask layer, top (414) and bottom (416) metal electrodes, and buffer layer (418) on a substrate (420).

FIG. 5 is a schematic top view of a first (bottom) SiO$_2$ mask layer, wherein the laser active region is delineated or patterned with long stripes (500), and the end regions of the active region is delineated or patterned with diffracting or reflecting elements (502) acting as laser mirrors.

Figure 6:
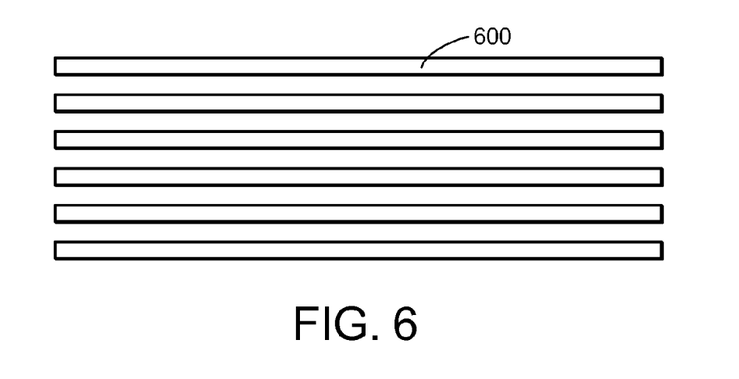
FIG. 6 is a schematic top view of the second (top) $SiO_2$ mask layer, wherein long stripes along the laser active region are used to avoid diffraction or reflection by the stripes.
Figure 7:
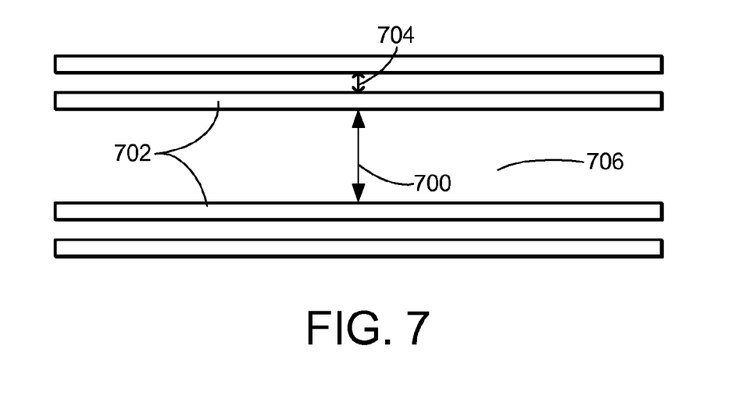
FIG. 7 is a schematic top view of the second (top) SiO$_2$ mask layer, in another configuration, wherein the wider separation between center stripes allows current injection and mode confinement.

FIG. 6 is a schematic top view of the second (top) SiO$_2$ mask layer, wherein long stripes (600) along the laser active region are used to avoid diffraction or reflection by the stripes (600).

FIG. 7 is a schematic top view of the second (top) SiO$_2$ mask layer in another configuration, wherein the wider separation (700) between center stripes (702), compared to other stripe separations (704), allows both concentrated current injection, as the center region (706) corresponds to electrically conductive GaN material after LEO growth, and mode confinement.

An active layer embedded between two SiO$_2$ mask layers, leads to excellent properties. Due to the high index contrast between the active layer and the bottom and/or top mask layers, even taking into account that the mask layer(s) have a refractive index between that of pure GaN and SiO$_2$, the laser mode is very well confined in the active region. To be more precise, the index difference between SiO$_2$ (index 1.45) and GaN (index 2.4) is 0.9. Taking into account that the SiO$_2$ coverage of the mask layer is in the 30-50% range, this still makes an effective index difference of 0.3-0.5, as compared to the 0.1 index difference between GaN and AlGaN. Therefore, the modal gain is high, leading to low lasing threshold. The overlap of the laser mode with the patterned mask is strong, leading to good properties of the pattern acting as diffraction gratings or mirrors. Also, the mode does not interact with the metal electrode.

The structuring of the top mask layer can also be designed purposely, e.g., it can act as a current aperture, funneling the current into the desired laser region, as shown in FIG. 7, to provide gain guided action. Also, that structuring can, through a lateral variation of the fractional coverage of $SiO_2$, using stripe separations (700), (704), as shown in FIG. 7, define lateral waveguiding for the laser mode as the central stripe will have a higher index than other stripes, due to its higher GaN content. Consequently, both gain and index waveguiding are available using this mask.

Moreover, the roles of the top and bottom mask layers can be interchanged.

In addition, various designs of the lower mask LEO layer may be utilized, according to U.S. Utility application Ser. No. 11/067,957.

Figure 8:
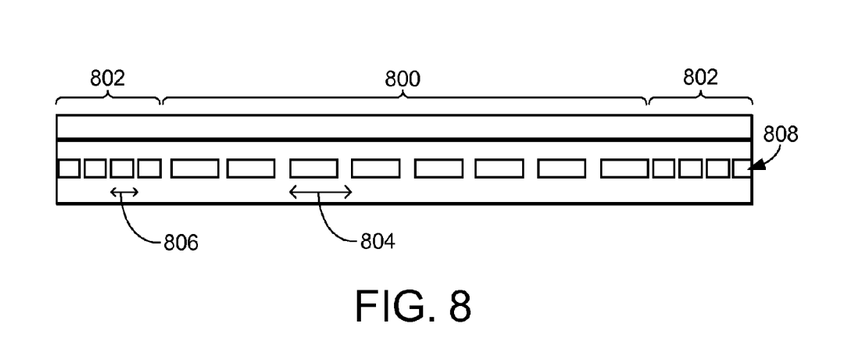
FIG. 8 is a schematic of the side view of the bottom perforated mask layer, for a laser with separate gain and mirror regions.

For example, the perforated LEO layer may perform like a mirror, thus providing the feedback for laser auto oscillation, as shown in FIG. 8. FIG. 8 is a schematic of the bottom perforated mask layer, for a laser with separate gain (800) and mirror (802) regions. This can be obtained either by having different periods (804), (806) and form factors of the patterned mask layer (808). For example, the period (804) for the gain region (800) may be different than the period (806) for the mirror region (802).

Figure 9:
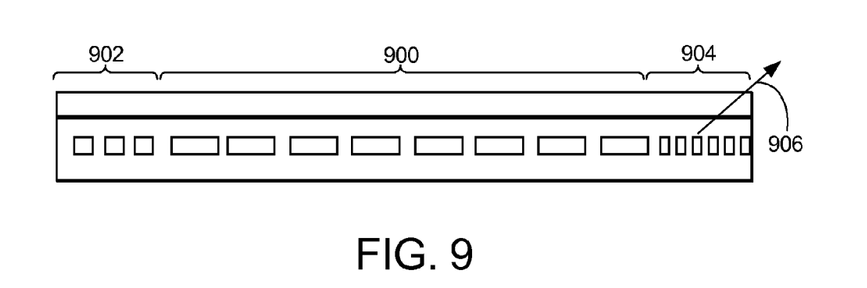
FIG. 9 is a schematic of the side view of the bottom perforated mask layer, for a laser with separate gain, mirror and diffracting outcoupling mirror regions.

The perforated LEO layer can also be used as an outcoupling mirror, by using proper design of one of the mirrors, as shown in FIG. 9. FIG. 9 is a schematic of the bottom perforated mask layer, for a laser with separate gain (900), mirror (902) and diffracting outcoupling or extracting mirror (904) regions. Outcoupling (906) occurs through diffraction towards air provided the right diffraction conditions are fulfilled.

Figure 10:
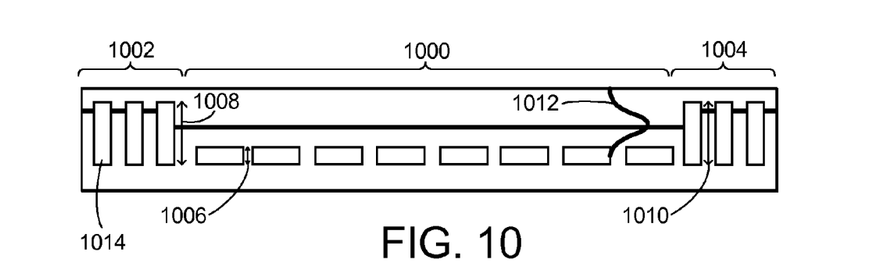
FIG. 10 is a schematic of the side view of the bottom perforated mask layer, for a laser with separate gain, mirror and extraction regions, with varying growth depths defined by perforated LEO layer etching.

In addition, better mirror properties for lasing and outcoupling can be obtained by having different depth of the etched perforated LEO layer, as shown in FIG. 10, which is a schematic of the bottom perforated mask layer for a laser with separate gain (1000), mirror (1002) and extraction (1004) regions, with varying mask layer thicknesses and depths (1006), (1008) and (1010), defined for example by variable perforated LEO mask layer etching, for the gain (1000), mirror (1002) and extraction regions (1004) respectively. Then, the guided mode (1012) interacts more strongly with the $SiO_2$ columns (1014) of the pattern in the mirror regions (1002) and (1004).

In addition to the added design possibilities offered by the varying $SiO_2$ thickness, the control of growth speed, through hole diameter and growth conditions, will allow diminished overlap of the guided mode with the active material (comprising, for example, quantum wells) within the mirrors, thus diminishing the absorption loss in the mirrors, a highly desirable feature.

Figure 11:
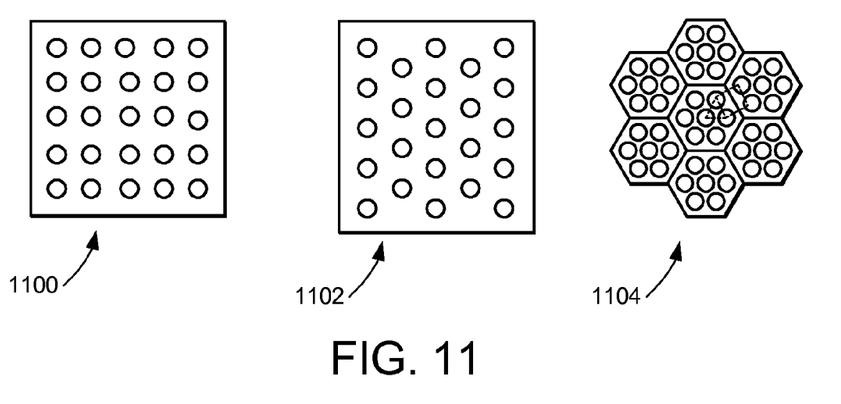
FIG. 11 illustrates a top view of the various geometries that can be used as perforations.

Various hole geometries can be used as perforations for the mask layer. The simplest geometries may be trenches of various periods and filling factors, linear or shaped, also with different directions to allow, for example, for preferred materials growth orientations. In addition, as shown in FIG. 11, holes organized in square or rectangular arrays or lattices (1100), so-called periodic photonic crystals, may be used. More complex geometries also lead to efficient light extraction, such as triangular lattices (1102), Archimedean tilings or lattices (1104). Finally, even random patterns, with a characteristic correlation length in the vicinity of the wavelength, can also act as efficient light outcouplers.

Figure 12:
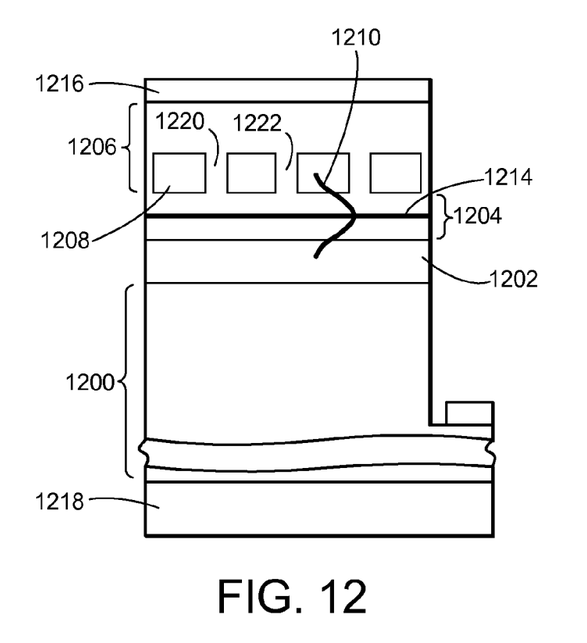
FIG. 12 is a schematic of a device with a contact layer grown over a patterned mask layer, by lateral epitaxial overgrowth (LEO) over an active layer.

FIG. 12 shows a simpler implementation, where the buffer layer (1200), bottom confining layer (1202), and active layer (1204) are grown as usual in a single growth. The top layer (1206) is grown by LEO over a patterned mask layer (1208) placed over the active layer (1204). Compared to the double LEO structures, the optical confinement of the laser wave (1210) within the active layer (1204) is weaker, as the bottom AlGaN confining layer (1202) has a smaller index difference with the active layer (1204) than a patterned mask layer, and therefore is less efficient in confining the laser wave (1210). However, the fabrication is greatly simplified, because the growth of the major active layer (1204), comprising, for example, 200 nm thick GaN and quantum well(s) (1214), does not rely on the delicate LEO process. Also, the LEO layer (1206) does not have to be doped with two types of dopant atoms, as its electrical function is only to contact the active layer (1204) with the top electrode (1216). The LEO layer (1206) might, however, have two types of carriers, if it is desired to use a tunnel junction for carrier injection. In this single LEO structure, the LEO mask pattern of the mask layer (1208) can use the patterns shown in FIGS. 5-11 to obtain the functions described above for the double LEO mask layers devices.

Therefore, FIG. 12 is an example of a structure using integrated optical elements, comprising a substrate (1218), a buffer layer (1200), one or more bottom confining layers (1202), one or more active layers (1204) grown on the optical confining layers (1202), one or more patterned layers (1206) deposited on top of the active layers (1204), wherein each of the patterned layers (1206) is comprised of a top LEO mask layer (1208) and a LEO nitride layer (1220) filling holes (1222) in the top LEO mask layer (1208), wherein the top LEO mask layers act as a mirror, optical confinement layer, grating, wavelength selective element, beam shaping element or beam directing element for the active layers (1204).

There are many possible implementations of this concept of lasers obtained by overgrowth on a perforated index layer in a thin film geometry. For example, the devices may be fabricated from semiconductor materials other than nitride materials or other active materials such as light emitting small molecules or polymers. In addition, throughout this disclosure and the figures of this disclosure, the $SiO_2$ used in the masks or patterns may be replaced with any other material, having a refractive index contrast with the semiconductor material, so that the patterned mask layers have the desired optical properties described above, such as optical confinement. Moreover, the roles of the top and bottom mask layers can be interchanged.

It is not necessary that the patterned layers and active layers are grown by LEO, therefore other growth methods may be used to grow these layers. In addition, multiple layers of the active layer, patterned regions, or optical confinement layers, for example, may be deposited.

Figure 13:
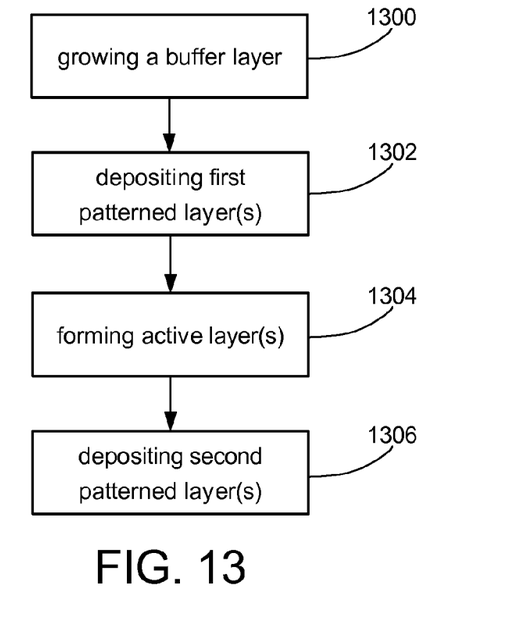
FIG. 13 is a flow chart illustrating a method of fabricating a structure using integrated optical elements.

FIG. 13 illustrates a method of fabricating a structure using integrated optical elements.

Block 1300 represents the step of growing a buffer layer on a substrate.

Block 1302 represents the step of depositing one or more first patterned layers on top of the buffer layer, wherein each of the first patterned layers is comprised of a bottom lateral epitaxial overgrowth (LEO) mask layer and a LEO nitride layer filling holes in the bottom LEO mask layer.

Block 1304 represents the step of forming one or more active layers on the first patterned layers.

Block 1306 represents the step of depositing one or more second patterned layers on top of the active layers, wherein each of the second patterned layers is comprised of a top LEO mask layer and a LEO nitride layer filling holes in the top LEO mask layer, wherein each patterned layer acts as a mirror, optical confinement layer, grating, wavelength selective element, beam shaping element or beam directing element for the active layers.

Figure 14:
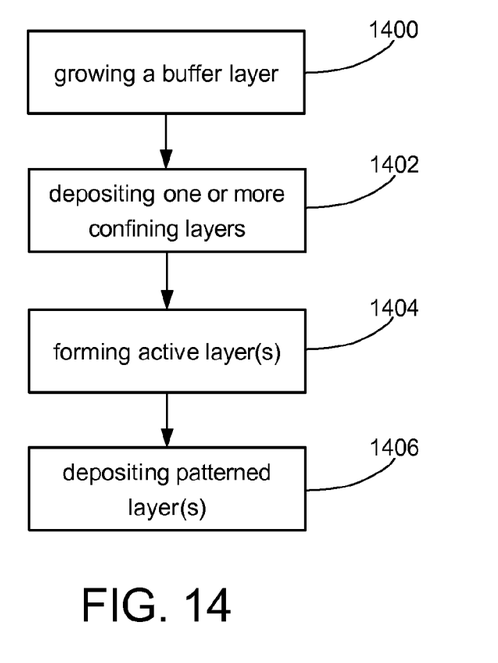
FIG. 14 is a flow chart illustrating another method of fabricating a structure using integrated optical elements.

FIG. 14 illustrates a second method of fabricating a structure using integrated optical elements.

Block 1400 represents the step of growing a buffer layer on a substrate.

Block 1402 represents the step of growing one or more bottom confining layers on the buffer layer.

Block 1404 represents the step of growing and one or more active layers on the one or more bottom confining layers.

Block 1406 represents the step of depositing one or more patterned layers on top of the active layers, wherein each of the patterned layers is comprised of a top LEO mask layer and a LEO nitride layer filling holes in the top LEO mask layer, wherein the patterned layers act as a mirror, optical confinement layer, grating, wavelength selective element, beam shaping element or beam directing element for the active layers.

REFERENCES

The following publications are incorporated by reference herein:

1. N. Eriksson, M. Hagberg and A. Larsson, Highly directional grating outcouplers with tailorable radiation characteristics, IEEE J. Quant. Electronics, vol. 32, 1038 (1996).
2. T. Suhara, M. Uemukai, N. Shimada and A. Larsson, Broad area and MOPA lasers with integrated grating components for beam shaping and novel functions, Proc. SPIE vol. 4995, 10 (2003).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A structure using integrated optical elements, comprising:
    (a) a substrate;
    (b) a buffer layer grown on the substrate;
    (c) one or more first patterned layers deposited on top of the buffer layer, wherein each of the first patterned layers is comprised of a bottom lateral epitaxial overgrowth (LEO) mask layer and a first LEO nitride layer filling holes in the bottom LEO mask layer;
    (d) one or more active layers formed on the first patterned layers; and
    (e) one or more second patterned layers deposited on top of the active layer, wherein each of the second patterned layers is comprised of a top LEO mask layer and a second LEO nitride layer filling holes in the top LEO mask layer;
    (f) wherein the top, bottom, or top and bottom LEO mask layers, act as a mirror, optical confinement layer, grating, wavelength selective element, beam shaping element or beam directing element for the active layers.

2. The structure of claim 1, wherein the first, second, or first and second patterned layers, due to a refractive index difference with the active layers, efficiently confine a laser mode to the active layers.

3. The structure of claim 1, wherein the first, second, or first and second patterned layers provide a current aperture giving a gain guided action.

4. The structure of claim 1, wherein the first, second, or first and second patterned layers provide lateral waveguiding for a laser mode in the active layers.

5. The structure of claim 1, wherein the first, second, or first and second patterned layers isolate a laser mode from one or more electrodes on the structure, thus diminishing absorption losses.

6. The structure of claim 1, wherein the top and bottom LEO mask layers comprise silicon dioxide.

7. The structure of claim 1, wherein one of the first or second patterned layers does not diffract.

8. The structure of claim 7, wherein the one of the first or second patterned layers that does not diffract is patterned as an ensemble of stripes along a direction of laser light propagation.

9. The structure of claim 8, wherein the one of the first or second patterned layers that does not diffract comprises end regions that are patterned with diffracting or reflecting elements.

10. The structure of claim 1, wherein the first or second patterned layers comprise a separate gain and two mirror regions.

11. The structure of claim 10, wherein patterns of the gain and mirror regions have different periods.

12. The structure of claim 10, wherein at least one of the mirror regions is an extraction region for extracting or outcoupling.

13. The structure of claim 12, wherein the separate gain, mirror and extraction regions have different growth depths, defined by etching of the first or second patterned layers, to provide improved mirror properties for lasing in the separate gain and mirror regions and outcoupling in the extraction region, and wherein a guided mode interacts more strongly with patterned columns in the mirror regions.

14. The structure of claim 1, wherein the second patterned layer is doped with either an n-type impurity or a p-type impurity.

15. A method of fabricating a structure using integrated optical elements, comprising:
    (a) growing a buffer layer on a substrate;
    (b) depositing one or more first patterned layers on top of the buffer layer, wherein each of the first patterned layers is comprised of a bottom lateral epitaxial overgrowth (LEO) mask layer and a first LEO nitride layer filling holes in the bottom LEO mask layer;
    (c) forming one or more active layers on the first patterned layers; and
    (d) depositing one or more second patterned layers on top of the active layers, wherein each of the second patterned layers is comprised of a top LEO mask layer and a second LEO nitride layer filling holes in the top LEO mask layer;
    (e) wherein each patterned layer acts as a mirror, optical confinement layer, grating, wavelength selective element, beam shaping element or beam directing element for the active layers.

16. A structure using integrated optical elements, comprising:
    (a) a substrate;
    (b) a buffer layer on the substrate, one or more bottom confining layers on the buffer layers and one or more active layers grown on the bottom confining layers; and
    (c) one or more patterned layers deposited on top of the active layers, wherein each of the patterned layers is comprised of a top LEO mask layer and a LEO nitride layer filling holes in the top LEO mask layer;

(d) wherein the top LEO mask layers act as a mirror, optical confinement layer, grating, wavelength selective element, beam shaping element or beam directing element for the active layers.

17. The structure of claim 16, wherein the patterned layers, due to a refractive index difference with the active layers, efficiently confine a laser mode to the active layer.

18. The structure of claim 16, wherein the patterned layers provide a current aperture giving gain guided action.

19. The structure of claim 16, wherein the patterned layers provide lateral waveguiding for a laser mode in the active layers.

20. The structure of claim 16, wherein the patterned layers isolate a laser mode from one or more electrodes, thus diminishing absorption losses.

21. A method of fabricating a structure using integrated optical elements, comprising:

(a) growing a buffer layer on a substrate, growing one or more bottom confining layers on the buffer layer, and growing one or more active layers on the bottom confining layers;

(b) depositing one or more patterned layers on top of the active layers, wherein each of the patterned layers is comprised of a top LEO mask layer and a LEO nitride layer filling holes in the top LEO mask layer;

(c) wherein the patterned layers act as a mirror, optical confinement layer, grating, wavelength selective element, beam shaping element or beam directing element for the active layers.

* * * * *